US012697808B2

(12) United States Patent
Johnson et al.

(10) Patent No.: US 12,697,808 B2
(45) Date of Patent: Aug. 4, 2026

(54) SURFACE MODIFICATION OF SOLDER PASTE STENCILS

(71) Applicant: NEWTECH LLC, Cincinnati, OH (US)

(72) Inventors: Steven Martin Johnson, Franklin, OH (US); Fraser Murray Shaw, Troon (GB)

(73) Assignee: NEWTECH LLC, Cincinnati, OH (US)

( * ) Notice: Subject to any disclaimer, the term of this patent is extended or adjusted under 35 U.S.C. 154(b) by 0 days.

(21) Appl. No.: 17/802,291

(22) PCT Filed: Feb. 27, 2021

(86) PCT No.: PCT/IB2021/051651
§ 371 (c)(1),
(2) Date: Aug. 25, 2022

(87) PCT Pub. No.: WO2021/171265
PCT Pub. Date: Sep. 2, 2021

(65) Prior Publication Data
US 2023/0141099 A1 May 11, 2023

Related U.S. Application Data

(60) Provisional application No. 62/983,357, filed on Feb. 28, 2020.

(51) Int. Cl.
| | |
|---|---|
| *B41C 1/14* | (2006.01) |
| *B41N 1/24* | (2006.01) |
| *C09D 183/04* | (2006.01) |
| *H05K 3/12* | (2006.01) |
| *H05K 3/3485* | (2026.01) |

(52) U.S. Cl.
CPC ............ *B41C 1/145* (2013.01); *C09D 183/04* (2013.01); *H05K 3/1225* (2013.01); *H05K 3/3485* (2020.08)

(58) Field of Classification Search
None
See application file for complete search history.

(56) References Cited

U.S. PATENT DOCUMENTS 3,668,028 A * 6/1972 Short ...................... B41C 1/145
216/48
3,696,742 A * 10/1972 Parts ...................... B41C 1/145
522/2
(Continued)

FOREIGN PATENT DOCUMENTS

| CA | 2850240 A1 * | 4/2013 | ............ B41F 35/003 |
| DE | 102010013348 A1 * | 10/2011 | ............. B41C 1/145 |

(Continued)

OTHER PUBLICATIONS

JP 2019-181904 A to Shibusawa, publication date Oct. 24, 2019 with English language machine translation. (Year: 2019).*

(Continued)

*Primary Examiner* — Leslie J Thompson
(74) *Attorney, Agent, or Firm* — FBT Gibbons LLP; Alexander J. Johnson; Vance V. VanDrake, III

(57) ABSTRACT

The present disclosure relates to surface modification of solder paste stencils to provide improved adhesion of a functional coating. The disclosed surface modifications include laser structuring, plasma treatments, and primers. Methods of using the solder paste stencils are further disclosed.

13 Claims, 3 Drawing Sheets

(56) References Cited

U.S. PATENT DOCUMENTS

| | | | |
|---|---|---|---|
| 4,980,536 A | 12/1990 | Asch et al. | |
| 5,346,118 A | 9/1994 | Degani et al. | |
| 5,424,508 A | 6/1995 | Swain et al. | |
| 5,460,316 A * | 10/1995 | Hefele | B41N 1/24 |
| | | | 118/406 |
| 5,588,359 A * | 12/1996 | Hofmann | G03F 7/12 |
| | | | 101/128.21 |
| 5,593,504 A | 1/1997 | Cala et al. | |
| 5,669,970 A * | 9/1997 | Balog | B05C 17/06 |
| | | | 118/301 |
| 9,205,639 B2 | 12/2015 | Wefers et al. | |
| 2005/0189402 A1 | 9/2005 | Westmoreland et al. | |
| 2014/0248443 A1 | 9/2014 | Eder et al. | |

FOREIGN PATENT DOCUMENTS

| | | | |
|---|---|---|---|
| DE | 102012100881 A1 | 8/2013 | |
| DE | 102014205547 A1 | 10/2015 | |
| EP | 2578413 B1 * | 1/2019 | B41C 1/148 |
| JP | 2009208259 A * | 9/2009 | |
| JP | 2014065256 A * | 4/2014 | |

OTHER PUBLICATIONS

WO 2014-189026 A1 to Shibusawa, publication date Nov. 27, 2014 with English language machine translation. (Year: 2014).*

English language machine translation of DE 10 2010 013 348 to Kleemann et al. from Google translate. (Year: 2011).*

JP 2008-117989 A to Sato et al., publication date May 22, 2008 with English language translation (Year: 2008).*

English translation of JP 2014065256 A to Matsuoka, publication date Apr. 17, 2014. (Year: 2014).*

English translation of JP 2009208259 A to Miyamoto, publication date Sep. 17, 2009. (Year: 2009).*

Young, Lee; International Search Report and Written Opinion of the International Searching Authority issued in International Application No. PCT/IB2021/051651; Jul. 15, 2021; 9 pages.

Wiedenhoft, Lisa; Extended European Search Report issued in European Patent Application No. 21761178.9; Feb. 23, 2024; 10 pages.

Zapka, W. et al.; Efficient pulsed laser removal of 0.2 µm sized particles from a solid surface; Appl. Phys. Lett. 58 (20); May 20, 1991; pp. 2217-2219.

* cited by examiner

| ISO 25178 - PRIMARY SURFACE | | |
|---|---|---|
| F: [WORKFLOW] LEVELED (3 POINTS) | | |
| λs FILTER: NO λs-FILTERING | | |
| HEIGHT PARAMETERS | | |
| Sq | 1.203 | µm |
| Ssk | 1.117 | |
| Sku | 4.490 | |
| Sp | 6.992 | µm |
| Sv | 5.141 | µm |
| Sz | 12.13 | µm |
| Sa | 0.8852 | µm |

SURFACE MODIFICATION OF SOLDER PASTE STENCILS

CROSS-REFERENCE TO RELATED APPLICATIONS

The application claims the priority benefit of U.S. Provisional Patent App. Ser. No. 62/983,357, entitled "SURFACE MODIFICATION OF SURFACE MOUNT TECHNOLOGY SOLDER PASTE STENCILS", filed Feb. 28, 2020, which is incorporated by reference herein in its entirety.

TECHNICAL FIELD

The present disclosure generally relates to surface modification of solder paste stencils.

BACKGROUND

Printed circuit boards ("PCBs") facilitate the electrical connections required between various components of most electronic products. To electrically connect surface mount devices, PCBs include a plurality of solder paste pads to which surface mount devices, such as integrated circuits, capacitors, resistors, and the like, are soldered to. The solder paste pads are applied to PCBs using a stencil which applies solder through a plurality of apertures in the stencil and a squeegee which forces the solder paste through the apertures. For the formation of solder paste pads for surface mount devices, a Surface Mount Technology ("SMT") stencil can be used.

DETAILED DESCRIPTION

Figure 1:
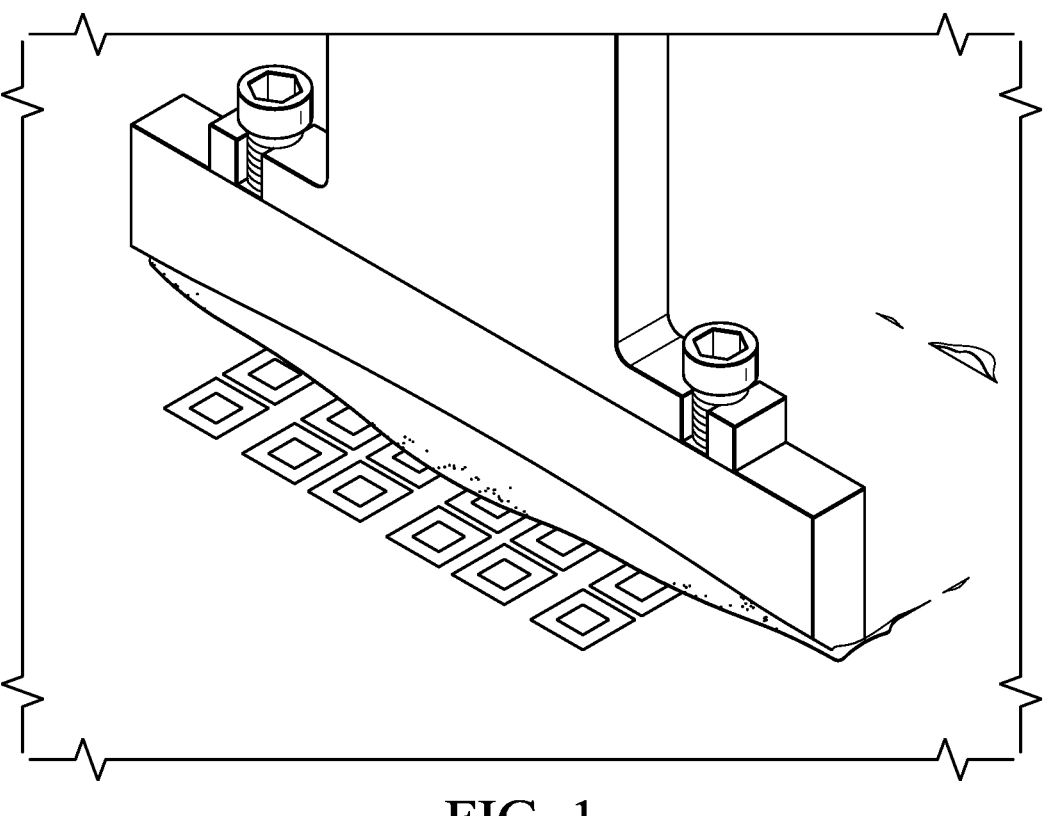
FIG. 1 depicts a photograph showing the use of a stencil and squeegee to form PCBs.

Solder paste stencils are widely used in the creation of Printed Circuit Boards ("PCBs") used in all but the simplest of electronic devices. Solder paste stencils are used to selectively deposit solder paste on lands, or pads, by pushing solder paste through apertures in the stencil. As depicted in FIG. 1, the pressure is typically applied by a squeegee (e.g., a stainless-steel squeegee) where both back and forth lateral motions and vertical force are applied to the backing of the stencil. As can be appreciated, various types of solder paste stencils are known. For example, Surface Mount Technology ("SMT") stencils are used to form solder paste pads for surface mount devices. To facilitate the transfer of solder paste through the apertures of a stencil to PCBs, the working surfaces of a stencil can be prepared in various ways.

For example, a stencil can include functional coatings, such as hydrophobic and/or oleophobic coatings, to provide various benefits, efficiencies, and cost savings to the use of the stencil. Without functional coatings, successive uses of a stencil can lead to a buildup of solder paste on the print side of the stencil due to solder paste being squeezed under the print surface from the forces involved in the application process. Unless the excess solder paste is removed, this solder paste can transfer onto the PCBs being printed and can create various issues including electrical bridging, poor profiles, misprints, and other defects on the PCBs.

To remove excess solder waste, various remedial processes are possible. For example, absorbent materials, such as an absorbent cloth, can be used to manually, or automatically, remove excess solder paste. Additionally, or alternatively, liquid cleaning agents and solvents can be used to remove excess solder paste. As can be appreciated however, the use of such processes is undesirable due to both the cost of the cleaning materials as well as the downtime required to complete such cleaning processes.

An example of a suitable functional coating is a hydrophobic and/or oleophobic coating. Application of a hydrophobic and/or oleophobic coating composition to the working surfaces of a stencil can prevent adherence of solder paste to the stencil and can prevent undesirable buildup of the solder paste. Hydrophobic and/or oleophobic coatings can improve the flow of solder paste through the aperture such that more solder can be transferred. The improved flow can facilitate the formation of a dependable solder joint.

As can be appreciated, various hydrophobic and oleophobic coatings are known for use with stencils including silicon-based and ceramic-based coatings. For example, suitable hydrophobic and/or oleophobic coatings for a stencil can include manganese oxide polystyrene nano-composite coatings, zinc oxide polystyrene nano-composite coatings, precipitated calcium carbonate coatings, carbon nanotube coatings, silica nano-coatings, fluorinated silane and fluoropolymer coatings, silicone coatings, polysiloxane coatings, polysilazane coatings, polytetrafluoroethylene coatings, polyvinylidene fluoride coatings, fluoroacrylate coatings, polychlorotrifluoroethylene coatings, perfluoroalkoxy polymer coatings, fluorinated ethylene-propylene coatings, polyethylenetetrafluoroethylene coatings, polyethylenechlorotrifluoroethylene coatings, perfluorinated elastomer coatings, perfluoropolyether coatings, perfluorosulfonic coatings, and combinations thereof such as incorporation of fluorinated moieties into silicone-containing coatings. Such coatings exhibit superior durability, low surface energies, and repellency to water-based and organic-based materials.

As will be appreciated, the use of functionalized coatings has become increasingly important to stencils. Demand for small, high-density, electronic assemblies has necessitated PCB's which include an increased number of small components. However, such PCB's require smaller solder lands/pads which, in turn, requires stencils to include smaller apertures and aspect ratios. The decrease in aperture size has led to increased difficulties in transferring sufficient volumes of solder paste to the PCB necessary to establish a dependable solder joint. For example, apertures having a reduced size can exhibit an increased tack force from the solder paste to the aperture walls. As can be appreciated, this occurs because the surface area of an aperture decreases slower than the volume within the aperture as the diameter of the aperture is reduced. Functionalized coatings can decrease the amount of tack force required to move solder paste through an aperture leading to improved printing quality and reduced maintenance.

As can be appreciated, stencils can also have relatively rough surfaces due to the processes used to form the stencil. For example, the apertures of a stencil are typically formed using a laser and can have a roughness of about 0.1 microns to about 0.5 microns (arithmetical mean deviation), or even greater. High surface roughness can be alleviated by functional coatings which overlay the rough surface and produce a smooth, low energy, surface with high slip properties.

Figure 2:
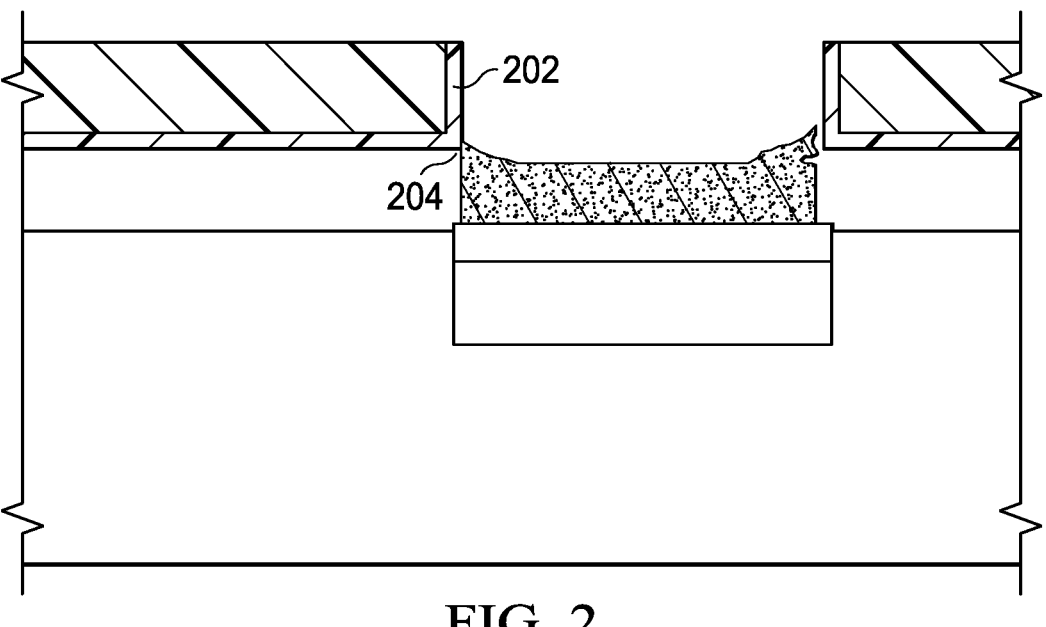
FIG. 2 depicts a cross-sectional side view of a stencil and aperture and illustrates a continuous functional coating covering the print side and aperture walls of the stencil.

In certain embodiments, it can be useful to form a functionalized coating as a continuous film as depicted in FIG. 2. As illustrated in FIG. 2, a continuous functionalizing coating (202) continually covers both the print side of a stencil and the aperture walls (204). As can be appreciated, a continuous coating can provide improved solder paste flow by providing a continuous functionalized coating for the entire solder paste flow with no discontinuities where solder paste flow could be detrimentally affected. Collectively, the functionalized coating can improve the transfer efficiency of a stencil and can permit more accurate printing, allowing smaller features and components to be manufactured.

Figure 3:
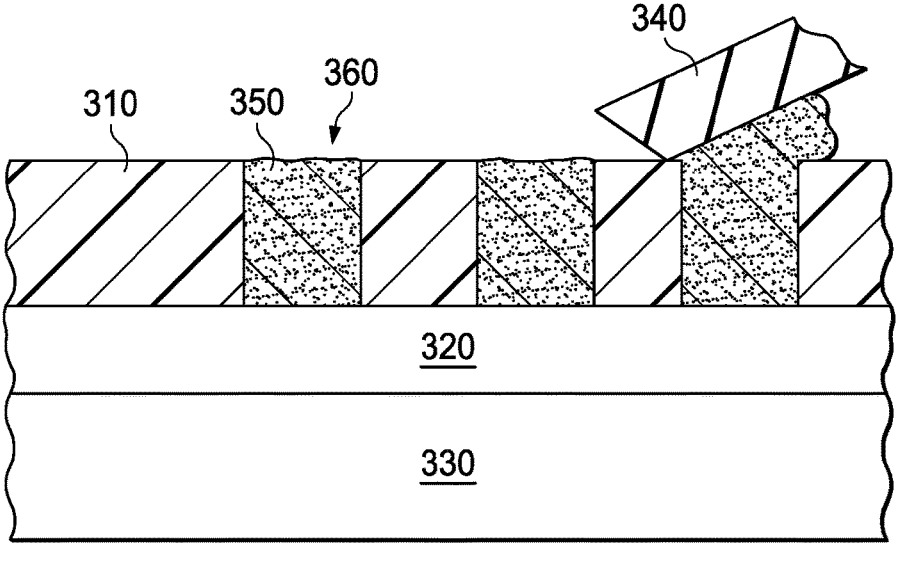
FIG. 3 depicts a cross-sectional side view of a stencil being used.

Unfortunately, functionalized coatings can suffer damage from repeated use of a stencil. For example, the vertical force used to force solder paste (350) to transfer through the apertures (360) can also deflect the stencil (310) towards a PCB board. Such actions can cause a stencil (310) to contact the PCB (320) including any PCB board lands, pads, and other raised features on the PCB (320) as depicted in FIG. 3. Such contact can cause damage, such as abrasion damage, evidenced by loss of adhesion of the functionalized coatings on the stencil. The damage can be microscopic, be located over visibly discrete areas, or even result in the complete delamination of the entire functionalized coating. Additionally, flexing of the stencil during application processes can also cause further damage such as delamination of the functional coating.

Once damage has occurred, additional adhesion loss of the functionalized coating, such as delamination, can propagate from additional contact, abrasion, and flexing. Moreover, the damage to the functionalized coating can also be further propagated by maintenance and remedial processes used to clean the stencil. For example, mechanical abrasion by the absorbent material, or chemical attack from the liquid cleaning agent, can cause further damage to the functionalized coating. Additionally, liquid cleaning agents can infiltrate under the coating and exacerbate further delamination.

Damage to the functionalized coating can negate the benefits of the functionalized coating and can result in solder paste sticking to the stencil, and as previously discussed, lowering the efficiency and print performance of the stencil.

Attempts at preventing damage to, and improving the adhesion of, the functional coating are known. For example, it is known to prepare stencils prior to coating with a functionalized coating with various chemical and mechanical treatments. Known chemical treatments include cleaning the stencil with water-based detergents (including high pH detergents) and/or hydrocarbon solvents to remove oils and other contaminants to provide a clean bonding surface. Known mechanical treatments include surface roughening (using, e.g., grit impregnated paper and brushes) to enhance physical bonding of the functionalized coating to a stencil.

However, known chemical and mechanical treatments are ineffective at preventing damage to a functionalized coating. In particular, these known methods suffer from a high degree of surface variability following treatment particularly in the areas around and between apertures. A high degree of control is necessary in these areas for improved results.

Methods of improving the adhesion of the functionalized coating to the working surfaces of a stencil through chemical and physical surface modification are disclosed herein. The surface modifications include one or more of laser structuring, plasma treatment, and the use of functionalized primer layers. Each of the disclosed surface modifications can provide for improved adhesion of a hydrophobic and/or oleophobic functional coating to a solder paste stencil. As can be appreciated, adhesion can be improved by modifying the surfaces to be free of all contaminants, three-dimensionally structuring the surface to be more wettable and to increase the total bonding area, and by physically, or chemically, modifying the surface the functional coating is to be adhered to.

As used herein, wettability refers to the ability of the functional coating to overcome the surface tension of the material of the stencil and wet out better. Improved wettability improves adhesion of the functional coating.

As disclosed herein, laser structuring of a stencil can be used to modify one or more surfaces of a stencil in several ways including the removal of contaminants and by physical structuring of one or more surfaces. The laser structuring processes described herein can generally include the step of exposing the surface of a stencil to laser radiation. The laser radiation can be applied in a single emission or in a series of one or more emissions.

In embodiments where laser structuring is used for the removal of contaminants, the one or more laser emissions can have sufficient energy to ablate any surface contaminants present on the surface of a stencil. For example, laser structuring can be used to remove contaminants such as oil or dirt through an ablation process. In certain embodiments following such laser structuring, the surface of a stencil can be directly coated with a suitable functional coating. In other such embodiments, the surface of a stencil can be further prepared with other surface modification techniques and/or additional cleaning.

In certain embodiments, laser structuring can alternatively, or additionally, be used to physically alter one or more surfaces of a stencil. In such embodiments, laser structuring can be used to form a predictable, 3-dimensional surface structure on one, or more, surfaces of the stencil to significantly improve adhesion, strength, and wettability of the functionalized coating. For example, laser structure can be used to increase the surface area of the one or more surfaces to increase wettability and/or increase surface tension.

In certain embodiments, the laser structuring can be used to form patterns across the surface of a stencil that can account for the geometry and apertures present on the surface of the stencil. For example, various patterns can be used surrounding the apertures, in the direction the squeegee is applied, etc.

In certain embodiments, the patterns formed using a laser structuring process can include a plurality of regularly spaced divots, or depressions, across the portions of the stencil to be coated by the functional coating (e.g., on the print surface and/or the aperture walls). Such divots can increase the surface area available for the functionalized coating to adhere to and can prevent any damage to the functionalized coating from propagating across the entire surface. In certain embodiments, the regularly spaced divots can be spaced apart in a substantially orthogonal grid with a uniform spacing of between about 10 μm to about 200 μm apart in both coordinate directions. In certain embodiments, the regularly spaced divots can be spaced apart about 80 μm in both coordinate directions. In embodiments where laser structuring is used to physically alter one or more surfaces, the one or more laser emissions can generally have sufficient energy to ablate small volumes of the material used to form the stencil. As can be appreciated, stencils are commonly formed from metals such as stainless steel, nickel, brass, or formed from various plastic such as polycarbonate. Suitable laser emissions can have sufficient energy to ablate stainless steel, nickel, brass, or plastic.

Generally, suitable lasers can be of any wavelength and can emit any level of energy per laser pulse such that sufficient energy is applied in the laser structuring process to move, or remove, the targeted material of interest (e.g., the contaminants or the material of the stencil itself). As can be appreciated, a different amount of energy can be required to ablate containments versus ablation of the stencil itself. For example, to laser structure a steel stencil and form divots, a suitable pulsed laser can have a laser pulse energy of about 0.25 mJ and a focused spot pitch of 0.08 mm (focused spot size diameter of 0.05 mm).

Figure 4:
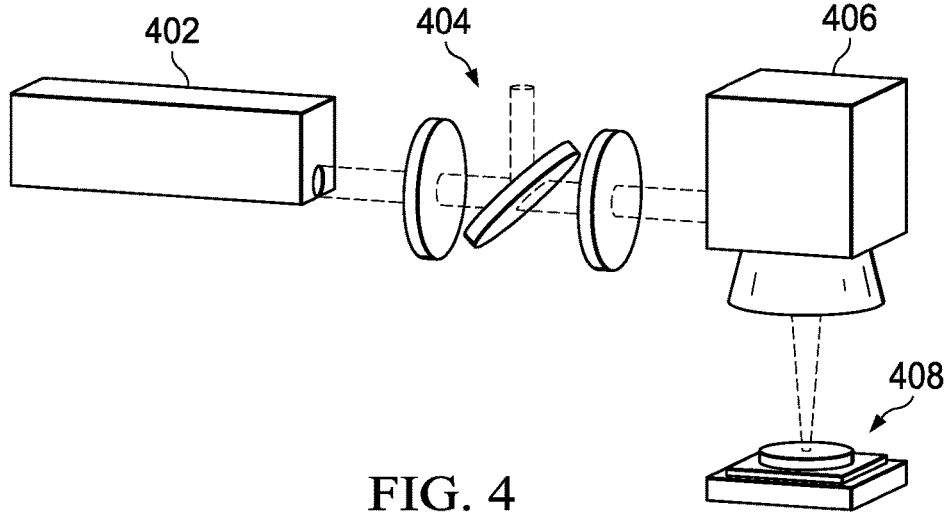
FIG. 4 depicts a schematic diagram of a suitable laser for a laser structuring process.

The laser emission can be transmitted to the surface of a stencil in any suitable manner. For example, the stencil can be stationary while the laser energy is applied in one or more emissions using either a moving laser or by the use of steering optics that deflect the laser path so as to control the path of the laser. Alternatively, or additionally, the laser can be stationary while the stencil is moved under the path of the laser emission. FIG. 4 depicts a schematic view illustrating a suitable laser setup including a laser 402, steering optics 404, a mirror 406, and the stencil 408. In certain embodiments, the area to be laser structured can be smaller than the entire stencil. In such embodiments, multiple laser structuring processes can be used to laser structure the surface of the entire stencil.

Advantageously, the laser used for surface modification can, in certain embodiments, be the same laser used to form the apertures in the solder paste stencil leading to processing efficiencies. In other certain embodiments, other suitable lasers can alternatively be used to form the apertures in the stencil (e.g., higher powered lasers). In such embodiments, each laser can be used separately or simultaneously. As can be appreciated, the laser structuring process can be modified in a large variety of ways. For example, selection of the laser source (including power source and wavelength), the size of the beam, the distance of the laser to the surface of the stencil, whether the laser is continuously or interment applied, and the speed of the scan can all be modified to optimize the results of a laser-structuring process.

In certain embodiments, a suitable laser can be a pulsed fiber laser. For example, a pulsed fiber laser having a wavelength of 1064 nm and focused to an area of $1 \times 10^{-10}$ $m^2$ to about $1 \times 10^{-9}$ $m^2$ has been found to provide sufficient power for laser structuring. In certain embodiments, the focused spot size can vary from a diameter of about 0.01 mm to about 0.10 mm and create a focused spot pitch of about 0.01 mm to about 0.10 mm.

As can be appreciated, the laser structuring processes described herein can advantageously be used to both remove contaminants and to structure one or more surfaces of a stencil. However, in certain embodiments, it can still be useful to include mechanical or chemical cleaning prior to and/or following a laser structuring process. For example, in certain embodiments, one or more of alcohol, deionized water, or a solution comprising trisodium phosphate and sodium laureth sulfate, can be useful to clean the stencil before or after a laser structuring process.

In certain embodiments, plasma treatment can additionally, or alternatively, be used to predictably modify the surface of a stencil. As can be appreciated, plasma is a partially ionized state of matter generated by introducing gas into a vacuum chamber and expositing the gas to an electromagnetic field. Collisions between free electrons and gas phase molecules can result in active ion and radical species. While plasma treatment can be used to eliminate contaminants, another use of plasma treatment is to deposit a tie layer to improve bond strength of the functionalized coating (e.g., the hydrophobic and/or oleophobic coating). Additional details about the use of a plasma treatment process to deposit a tie layer are described in PCT Patent App. No. WO 03/101733, incorporated by reference herein. As can be appreciated, the tie layer can have functional groups, such as hydroxyl, carbonyl, or other reactive groups, on its surface available for chemical bonding to the functional coating.

The plasma treatment can be modified by selection of one or more of the type of plasma, the gases used, the polymers or monomers selected, the selected temperature or temperature profiles, the pressure, the speed of treatment, any additive substances used in the process, and the selected surface tension.

In certain embodiments, primers applied by conventional means, such as spraying, dipping, sputtering, chemical vapor deposition, or brushing, can also be used to prepare a surface for increased bonding strength by acting as a tie layer between the substrate and the final coating. For example, primers designed to bond to metal can covalently form strong bonds to the stencil and provide an attachment layer for the functionalized coating to adhere to. Primers can generally be formed from polymers, oligomers, or monomers and can be applied as known in the art. For example, the primers can be dissolved in a solvent and sprayed onto the stencil or can be applied using a chemical vapor deposition process and polymerized on the surface of the stencil. As will be appreciated, the primers can have functional groups such as hydroxyl, carboxyl, or other functional groups that can form strong bonds to the functional coating (e.g., the hydrophobic and/or oleophobic coating). Both the plasma and chemically applied primers can form a flexible bonding, or tie, layer between the functional coating and the surface of the solder paste stencil.

As can be appreciated, primers can be modified in various ways. For example, the type of primer, the number of layers of primer applied, and the selected method of applying the primer can all be varied. Additionally, the temperature at which the primer and the functionalized coating are applied can also be varied. Examples of suitable primers can include Thermoset P-1291 and Thermoset P-1292, both available from the Parker Lord Corporation (Cleveland, OH).

In certain embodiments, more than one of laser structuring, plasma treatment, and primers can be used to improve the adhesion strength of a functionalized coating to a stencil. For example, laser structuring can be used in conjunction with one or more of plasma treatment and primers to create a surface that is both physically and chemically modified for improved bonding strength. In certain embodiments, a combination of all three methods can be used. In certain embodiments, only two processes can be used such as a combination of laser structuring and plasma treatment or laser structuring and the use of a primer.

In certain embodiments, one or more of laser structuring, plasma treatment, and primers can additionally be combined with known surface preparation techniques. For example, the one or more of laser structuring, plasma treatment, and primer treatment can be combined with surface cleaning using a high pH water detergent or hydrocarbon solvent and/or mechanical abrasion in certain embodiments.

Examples

To measure adhesion strength of a functional coating, three sample SMT stencils were prepared and evaluated for scratch resistance. Example 1 was a control, Example 2 was modified using a plasma treatment process, and Example 3 was structured using a laser structuring process. Each example was evaluated 3 times using a scratch-force tester from R-Tec Instruments (San Jose, CA). The results are depicted in Table 1 and shown in FIG. 5.

Example 3 was specifically formed by cleaning a stencil with alcohol and then proceeding to place the stencil in a movable gantry. By moving the gantry, a pulsed fiber laser having a wavelength of 1064 nm and a focused spot size of 0.05 mm in diameter and a laser pulse energy of 0.25 mJ was used to create an orthogonal grid of divots on all areas of the stencil where a hydrophobic and oleophobic coating was to be applied. The divots were spaced 0.08 mm apart in both the X and Y axis. Following the laser structuring, the surface of the stencil was cleaned with a cleaning solution comprising 9% trisodium phosphate and 0.49% sodium laureth sulfate, and the remainder deionized water. The stencil was immersed in the cleaning solution for 3 minutes, scrubbed with a lint free wipe, immersed for 1 additional minute in the cleaning solution, before being rinsed with deionized water and dried with clean, dry, compressed air. The dried stencil was then coated with a hydrophobic and oleophobic coating composition identical to the coating composition of Examples 1 and 2.

TABLE 1

|  | Critical Load (N) | Standard Deviation |
| --- | --- | --- |
| Example 1 | 0.27305 | 1.4% |
| Example 2 | 0.54295 | 1.0% |
| Example 3 | 0.59495 | 1.0% |

Figure 5:
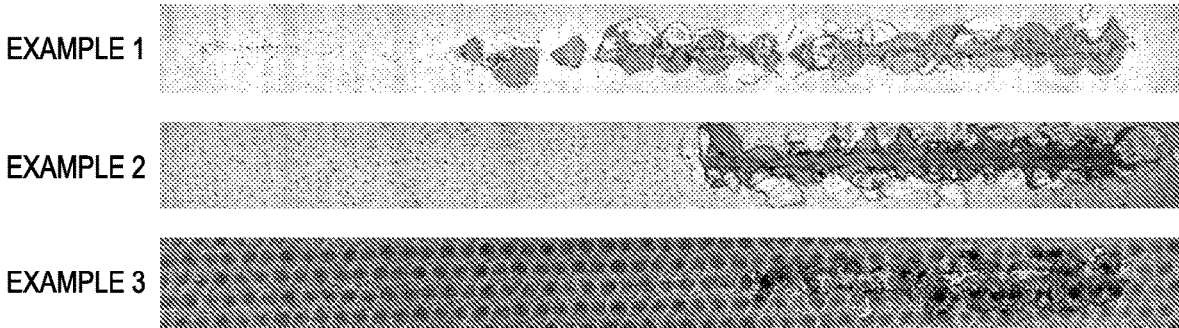
FIG. 5 depicts a photograph showing the results of evaluating several examples for scratch resistance.

As depicted in FIG. 5, comparative Example 1, exhibited the worst scratch resistance while both inventive Examples 2 and 3 exhibited improved scratch resistance. Example 3, structured by an inventive laser structuring process, exhibited the greatest amount of scratch resistance. The orthogonal array of microstructured divots is visible in the depiction of Example 3.

Table 2 depicts evaluation of the mean force to remove a hydrophobic and oleophobic coating composition from several example stencils. Specifically, Table 2 includes a control stencil (Example 4), a stencil prepared with a silane based primer (Thermoset P-1292 Primer available from Parker Lord Corporation (Cleveland, OH) (Example 5), a stencil prepared with a second silane-based primer (Thermoset P-1291 Primer available from Parker Lord Corporation (Cleveland, OH) (Example 6), a stencil modified to have a silane tie-layer formed using an oxygen-based plasma (Example 7), and a laser structured stencil similar to Example 3 from Table 1 (Example 8). All examples except Example 7 were cleaned with a high pH detergent before application of a hydrophobic and oleophobic coating. Each example was evaluated using a Nordson DAGE Scrape Tester to determine the mean force required to remove the applied hydrophobic and oleophobic coating.

TABLE 2

|  | Surface Modification | Mean Force to Remove Coating (grams) |
| --- | --- | --- |
| Example 4 | None (Control) | 14.92 |
| Example 5 | Silane-Based Primer | 127.3 |
| Example 6 | Silane-Based Primer | 83.7 |
| Example 7 | Silane Tie-Layer (Plasma Treatment) | 26.1 |
| Example 8 | Laser Structuring | 121.75 |

As depicted in Table 2, Examples 5 and 8 demonstrated the best results in improving the adhesion strength of a hydrophobic and oleophobic coating.

Figure 6:
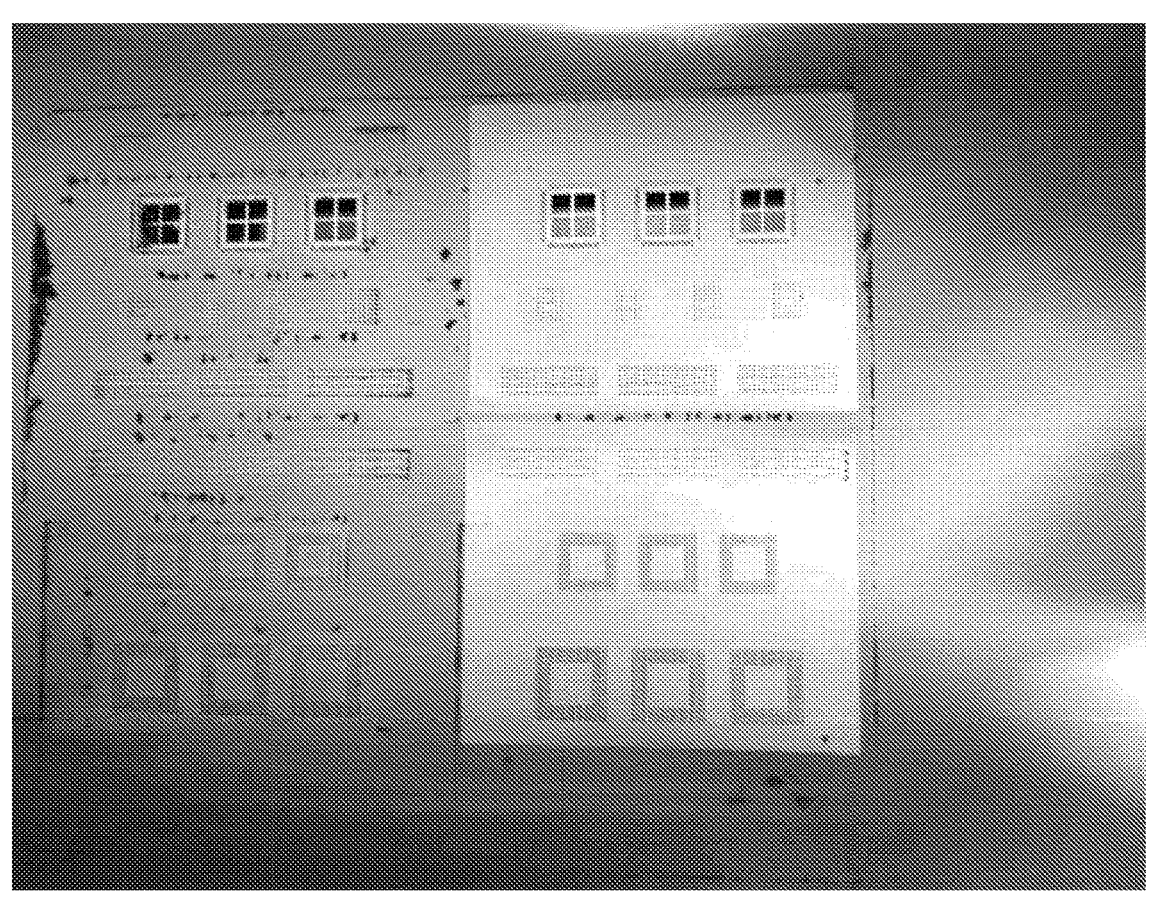
FIG. 6 depicts a photograph showing the print surfaces of two SMT stencils.

FIG. 6 depicts a photograph showing the print surfaces of two SMT stencils. The stencil on the left is unmodified while the stencil on the right has been modified with a laser structuring process similar to the process used in Examples 3 and 8. As depicted in FIG. 6, the laser-structured stencil exhibits substantially less chipping of the functionalized coating.

Figure 7:
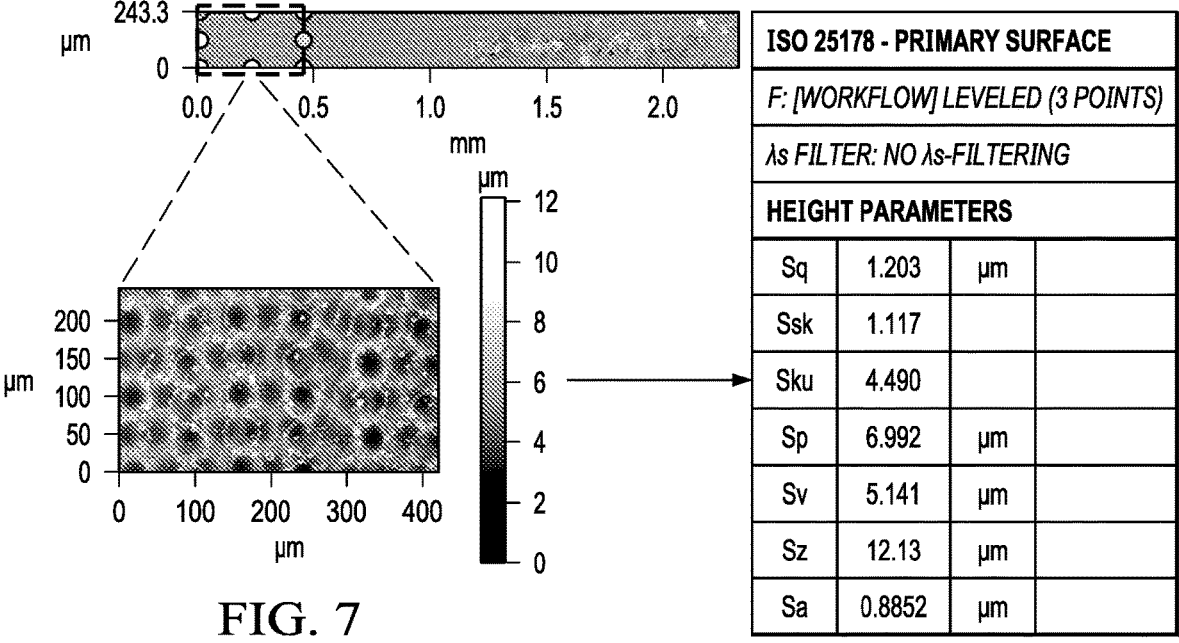
FIG. 7 depicts a surface analysis of a laser-structured SMT stencil.

FIG. 7 depicts a surface analysis of a laser-structured SMT stencil showing the topography created by the laser-structuring process. As depicted in FIG. 7, the laser structuring process created a difference in topography of about 0.9 microns.

It should be understood that every maximum numerical limitation given throughout this specification includes every lower numerical limitation, as if such lower numerical limitations were expressly written herein. Every minimum numerical limitation given throughout this specification will include every higher numerical limitation, as if such higher numerical limitations were expressly written herein. Every numerical range given throughout this specification will include every narrower numerical range that falls within such broader numerical range, as if such narrower numerical ranges were all expressly written herein.

Every document cited herein, including any cross-referenced or related patent or application, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests, or discloses any such invention. Further, to the extent that any meaning or definition of a term in this document conflicts with any meaning or definition of the same term in a document incorporated by reference, the meaning or definition assigned to that term in the document shall govern.

The foregoing description of embodiments and examples has been presented for purposes of description. It is not intended to be exhaustive or limiting to the forms described. Numerous modifications are possible in light of the above teachings. Some of those modifications have been discussed and others will be understood by those skilled in the art. The embodiments were chosen and described for illustration of ordinary skill in the art. Rather it is hereby intended the scope be defined by the claims appended various embodiments. The scope is, of course, not limited to the examples or embodiments set forth herein, but can be employed in any number of applications and equivalent articles by those of hereto.

What is claimed is:
1. A method of modifying one or more surfaces of a stencil, the method comprising:

forming apertures in the one or more surfaces with a first laser;

ablating the one or more surfaces and/or one or more aperture walls of the formed apertures with laser radiation from a second laser, wherein the laser radiation comprises a wavelength of about 1064 nm;

treating the one or more surfaces with a plasma treatment process to form a functionalized primer layer; and applying a hydrophobic and oleophobic coating;

wherein the step of ablating forms structures and removes contaminants present in the one or more surfaces and/or the one or more aperture walls of the formed apertures, wherein the structures in the one or more surfaces and/or the one or more aperture walls of the formed apertures comprise a three-dimensional pattern, wherein the three-dimensional pattern comprises an orthogonal grid of divots, and wherein each divot is spaced apart by about 50 μm to 150 μm in each coordinate direction of each divot.

2. The method according to claim 1, wherein the stencil is a Surface Mount Technology ("SMT") stencil.

3. The method according to claim 1, wherein the structures have a depth of about 1 micron or less.

4. The method according to claim 1, wherein the one or more surfaces of the stencil is a working surface of the stencil.

5. The method according to claim 1, wherein the laser radiation is swept across the one or more surfaces and/or the one or more aperture walls of the formed apertures by moving a laser or by use of steering optics.

6. The method according to claim 1, wherein the laser radiation is swept across the one or more surfaces and/or the one or more aperture walls of the formed apertures by moving the stencil.

7. The method according to claim 1, wherein the laser radiation is focused to an area of about $1 \times 10^{-10}$ m$^2$ to about $5 \times 10^{-10}$ m$^2$.

8. The method according to claim 1, wherein the laser radiation is generated by a pulsed fiber laser.

9. The method according to claim 8, wherein the pulsed fiber laser has an energy of about 0.25 mJ per pulse.

10. The method according to claim 1, wherein the hydrophobic and oleophobic coating is formed from a composition comprising a silica-based polymer and a compound comprising a fluorine containing moiety.

11. The method according to claim 1, wherein the stencil exhibits improved resistance to chipping during operation as compared to a stencil that has not had one or more surfaces and/or the one or more aperture walls of the formed apertures ablated with laser radiation.

12. The method according to claim 1, wherein the first laser is the same as the second laser.

13. The method according to claim 1, wherein the first laser is different than the second laser.

* * * * *